(12) United States Patent
Wright et al.

(10) Patent No.: US 8,212,155 B1
(45) Date of Patent: Jul. 3, 2012

(54) INTEGRATED PASSIVE DEVICE

(76) Inventors: Peter V. Wright, Portland, OR (US); Kenneth Mays, Tigard, OR (US)

( * ) Notice: Subject to any disclaimer, the term of this patent is extended or adjusted under 35 U.S.C. 154(b) by 938 days.

(21) Appl. No.: 11/823,413

(22) Filed: Jun. 26, 2007

(51) Int. Cl.
  *H05K 1/11* (2006.01)
(52) U.S. Cl. ........ 174/263; 174/259; 174/260; 361/760; 361/311; 336/200; 257/300; 257/778
(58) Field of Classification Search ........... 174/263, 174/259, 260; 361/760, 311; 336/200; 257/300, 257/778
See application file for complete search history.

(56) References Cited

U.S. PATENT DOCUMENTS

| | | | |
|---|---|---|---|
| 3,798,059 A * | 3/1974 | Astle et al. ............... 336/229 |
| 4,191,248 A * | 3/1980 | Huebsch et al. .......... 166/66.7 |
| 5,166,965 A * | 11/1992 | Collier ...................... 378/101 |
| 5,351,163 A * | 9/1994 | Dawson et al. .......... 361/321.1 |
| 5,373,112 A * | 12/1994 | Kamimura et al. ........ 174/255 |
| 5,478,773 A * | 12/1995 | Dow et al. ................. 438/381 |
| 5,492,856 A * | 2/1996 | Ikeda et al. ............... 438/381 |
| 5,497,028 A * | 3/1996 | Ikeda et al. ............... 257/531 |
| 5,500,552 A * | 3/1996 | Ikeda et al. ............... 257/531 |
| 5,529,831 A * | 6/1996 | Waga et al. ............... 428/209 |
| 5,548,265 A * | 8/1996 | Saito ......................... 336/200 |
| 5,825,092 A * | 10/1998 | Delgado et al. .......... 257/778 |
| 6,051,448 A * | 4/2000 | Hayama et al. .......... 438/108 |
| 6,084,515 A * | 7/2000 | Maitin et al. ............ 340/572.3 |
| 6,087,921 A * | 7/2000 | Morrison .................. 336/200 |
| 6,114,938 A * | 9/2000 | Iida et al. ................. 336/200 |
| 6,181,249 B1* | 1/2001 | Maitin et al. ............ 340/572.3 |
| 6,329,890 B1* | 12/2001 | Brooks et al. ............ 333/204 |
| 6,380,608 B1* | 4/2002 | Bentley .................... 257/531 |
| 6,426,680 B1* | 7/2002 | Duncan et al. ............ 331/34 |
| 6,492,885 B1* | 12/2002 | Murata et al. ............ 333/185 |
| 6,600,181 B2* | 7/2003 | Otake et al. .............. 257/277 |
| 6,661,078 B2* | 12/2003 | Shitara ..................... 257/528 |
| 6,674,355 B2* | 1/2004 | Harding .................... 336/212 |
| 6,684,065 B2* | 1/2004 | Bult et al. ................ 455/252.1 |
| 6,744,320 B2* | 6/2004 | Nguyen et al. ........... 330/254 |
| 6,781,229 B1* | 8/2004 | Fazelpour ................. 257/700 |
| 6,800,941 B2* | 10/2004 | Lee et al. .................. 257/773 |
| 6,831,543 B2* | 12/2004 | Mizoguchi et al. ....... 336/200 |
| 6,838,970 B2* | 1/2005 | Basteres et al. .......... 336/200 |
| 6,885,275 B1* | 4/2005 | Chang ....................... 336/200 |
| 6,903,645 B2* | 6/2005 | Mizoguchi et al. ....... 336/200 |
| 6,933,205 B2* | 8/2005 | Matsuo et al. ............ 438/406 |
| 6,987,307 B2* | 1/2006 | White et al. .............. 257/508 |
| 7,012,323 B2* | 3/2006 | Warner et al. ............ 257/676 |
| 7,068,124 B2* | 6/2006 | White et al. .............. 333/185 |
| 7,106,388 B2* | 9/2006 | Vorenkamp et al. ...... 348/726 |
| 7,109,825 B2* | 9/2006 | Song ......................... 333/184 |
| 7,126,452 B2* | 10/2006 | Teshima et al. .......... 336/200 |
| 7,132,888 B2* | 11/2006 | Behzad ..................... 330/254 |
| 7,145,428 B2* | 12/2006 | Chiu ......................... 336/200 |
| 7,170,384 B2* | 1/2007 | Kim et al. ................ 336/200 |
| 7,209,026 B2* | 4/2007 | Frutschy et al. .......... 336/200 |
| 7,230,316 B2* | 6/2007 | Yamazaki et al. ........ 257/531 |
| 7,276,970 B2* | 10/2007 | Khorramabadi .......... 330/253 |
| 7,339,451 B2* | 3/2008 | Liu et al. .................. 336/200 |
| 7,345,563 B2* | 3/2008 | Pavier ....................... 336/200 |
| 7,348,654 B2* | 3/2008 | Hsieh et al. .............. 257/528 |
| 7,350,175 B2* | 3/2008 | Iwaki et al. ............... 716/115 |
| 7,375,977 B2* | 5/2008 | Maeda et al. ............. 361/763 |
| 7,417,525 B2* | 8/2008 | Lee et al. .................. 336/200 |
| 7,439,840 B2* | 10/2008 | Carastro et al. .......... 336/200 |

(Continued)

*Primary Examiner* — Xiaoliang Chen

(57) ABSTRACT

Embodiments of an integrated passive device include a high-aspect ratio conductive line positioned on a carrier, a substrate, and a bump that secures the high-aspect ratio conductive line to the substrate.

22 Claims, 15 Drawing Sheets

U.S. PATENT DOCUMENTS

| | | | |
|---|---|---|---|
| 7,473,999 B2* | 1/2009 | Lin et al. | 257/738 |
| 7,477,123 B2* | 1/2009 | Beerling | 336/200 |
| 7,489,914 B2* | 2/2009 | Govind et al. | 455/168.1 |
| 7,511,588 B2* | 3/2009 | Gabara | 331/117 FE |
| 7,519,328 B2* | 4/2009 | Dokai et al. | 455/41.2 |
| 7,531,407 B2* | 5/2009 | Clevenger et al. | 438/238 |
| 7,573,119 B2* | 8/2009 | Kobayashi et al. | 257/531 |
| 7,619,296 B2* | 11/2009 | Nakashiba | 257/531 |
| 7,629,860 B2* | 12/2009 | Liu et al. | 333/25 |
| 7,649,746 B2* | 1/2010 | Hirohashi et al. | 361/760 |
| 7,663,196 B2* | 2/2010 | Liu et al. | 257/416 |
| 7,688,160 B2* | 3/2010 | Liu et al. | 333/185 |
| 7,907,043 B2* | 3/2011 | Mori | 336/200 |
| 2002/0090755 A1* | 7/2002 | Matsuzaki et al. | 438/108 |
| 2002/0093413 A1* | 7/2002 | Shin'ei | 336/200 |
| 2002/0180001 A1* | 12/2002 | Woo et al. | 257/546 |
| 2003/0042316 A1* | 3/2003 | Teraura | 235/487 |
| 2003/0043010 A1* | 3/2003 | Yeo et al. | 336/200 |
| 2003/0067052 A1* | 4/2003 | Matsuo et al. | 257/531 |
| 2003/0151485 A1* | 8/2003 | Lewis | 336/200 |
| 2003/0151849 A1* | 8/2003 | Sasaki et al. | 360/123 |
| 2003/0222295 A1* | 12/2003 | Lin | 257/300 |
| 2004/0066251 A1* | 4/2004 | Eleftheriades et al. | 333/117 |
| 2004/0145826 A1* | 7/2004 | Sasaki et al. | 360/126 |
| 2004/0164835 A1* | 8/2004 | Shoji | 336/200 |
| 2005/0000729 A1* | 1/2005 | Iljima et al. | 174/260 |
| 2005/0080345 A1* | 4/2005 | Finburgh et al. | 600/485 |
| 2005/0099259 A1* | 5/2005 | Harris et al. | 336/200 |
| 2005/0099278 A1* | 5/2005 | Kawaura et al. | 340/435 |
| 2005/0134522 A1* | 6/2005 | Waltho | 343/909 |
| 2005/0199734 A1* | 9/2005 | Puschner et al. | 235/492 |
| 2005/0258509 A1* | 11/2005 | Horikawa et al. | 257/531 |
| 2005/0275497 A1* | 12/2005 | Ramadan et al. | 336/200 |
| 2006/0131724 A1* | 6/2006 | Sato et al. | 257/690 |
| 2006/0145805 A1* | 7/2006 | Kim et al. | 336/200 |
| 2006/0158300 A1* | 7/2006 | Korony et al. | 336/200 |
| 2006/0170072 A1* | 8/2006 | Nakashiba | 257/531 |
| 2006/0192647 A1* | 8/2006 | Harris et al. | 336/200 |
| 2006/0284716 A1* | 12/2006 | Yamaguchi | 336/199 |
| 2007/0139976 A1* | 6/2007 | deRochemont | 363/17 |
| 2007/0152796 A1* | 7/2007 | He et al. | 336/223 |
| 2007/0188281 A1* | 8/2007 | Iguchi et al. | 335/299 |
| 2007/0246805 A1* | 10/2007 | Zhang et al. | 257/659 |
| 2007/0247268 A1* | 10/2007 | Oya et al. | 336/200 |
| 2007/0253144 A1* | 11/2007 | Kuwajima | 361/311 |
| 2008/0001698 A1* | 1/2008 | Hazucha et al. | 336/200 |
| 2008/0309442 A1* | 12/2008 | Hebert | 336/65 |
| 2010/0090781 A1* | 4/2010 | Yamamoto et al. | 333/167 |
| 2010/0141369 A1* | 6/2010 | Mori | 336/200 |

* cited by examiner

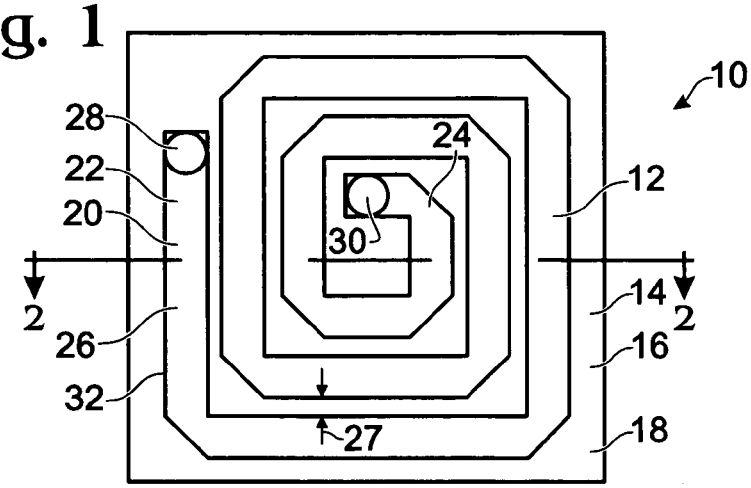
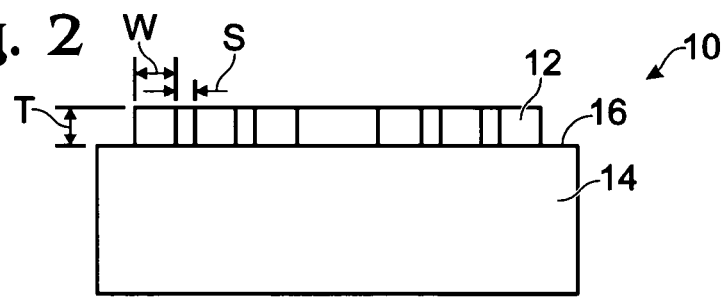
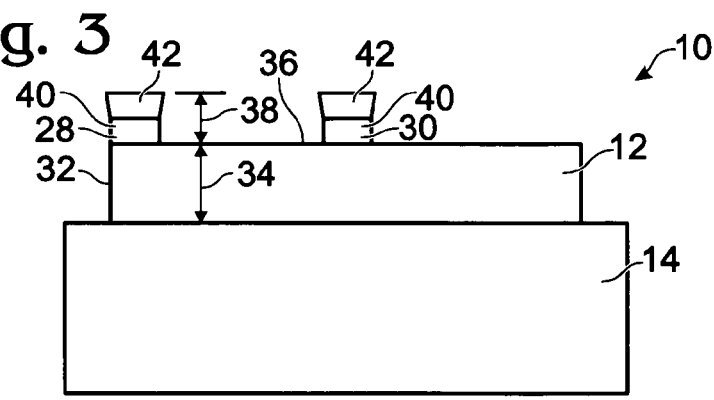
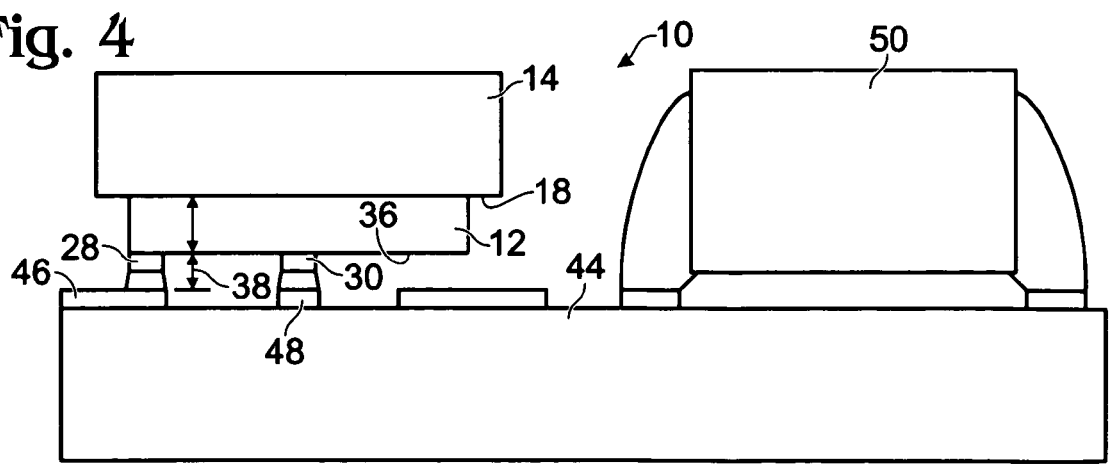

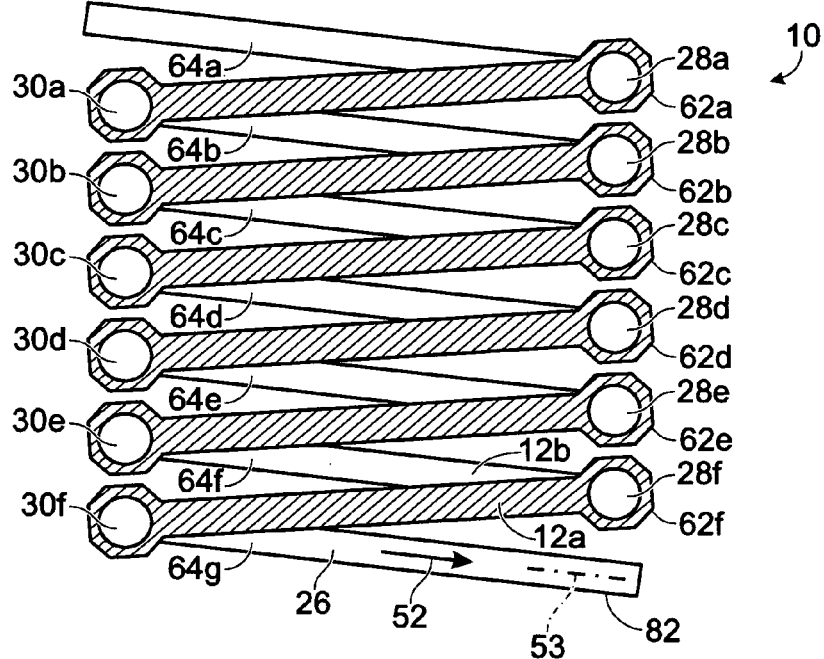
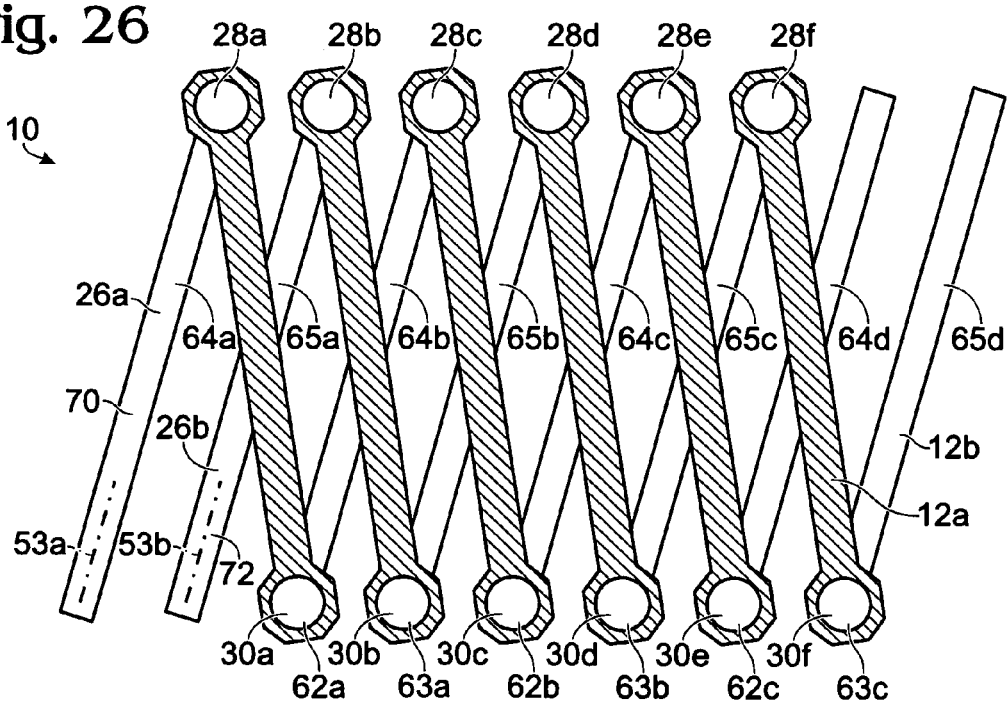

INTEGRATED PASSIVE DEVICE

BACKGROUND

Integrated circuits (ICs) may include passive devices such as inductors, couplers, and transformers secured thereon. The passive devices may be discrete, wire wound devices that may be bulky and may be difficult to secure on a substrate. These disadvantages are particularly problematic when an array of devices may be desired.

BRIEF DESCRIPTION OF THE DRAWINGS

Embodiments of the invention are illustrated by way of example, and not by way of limitation, in the figures of the accompanying drawings in which like reference numerals refer to similar elements.

FIG. 1 is a top view of one example embodiment of a passive device.

FIG. 2 is a cross-section through the center of the passive device of FIG. 1.

FIG. 3 is a side view of the passive device of FIG. 1, including bumps.

FIG. 4 is a side view of the passive device of FIG. 1 secured on a substrate.

FIG. 24 is a top view of another two plane planar embodiment of a passive device.

FIG. 26 is a top view of a two-plane planar coupler/transformer passive device.

DETAILED DESCRIPTION OF THE INVENTION

Figure 5:
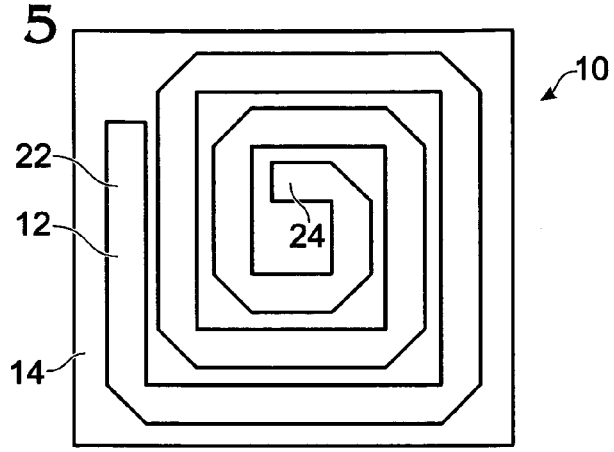
FIG. 5 is a top view of another example embodiment of a passive device.
Figure 6:
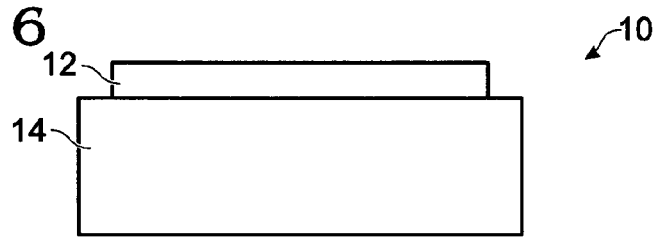
FIG. 6 is a side view of the passive device of FIG. 5.
Figure 7:
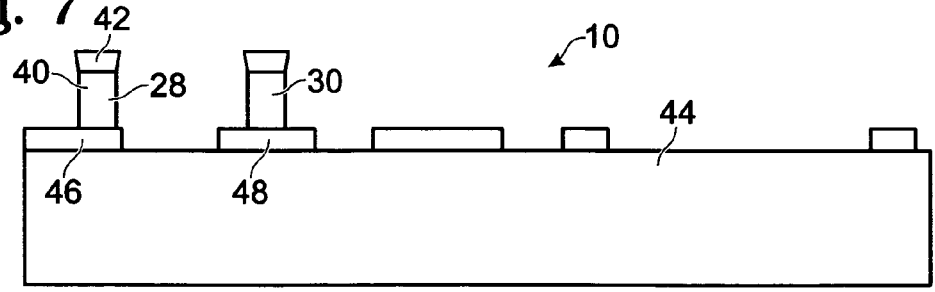
FIG. 7 is a side view of a substrate including bumps.
Figure 8:
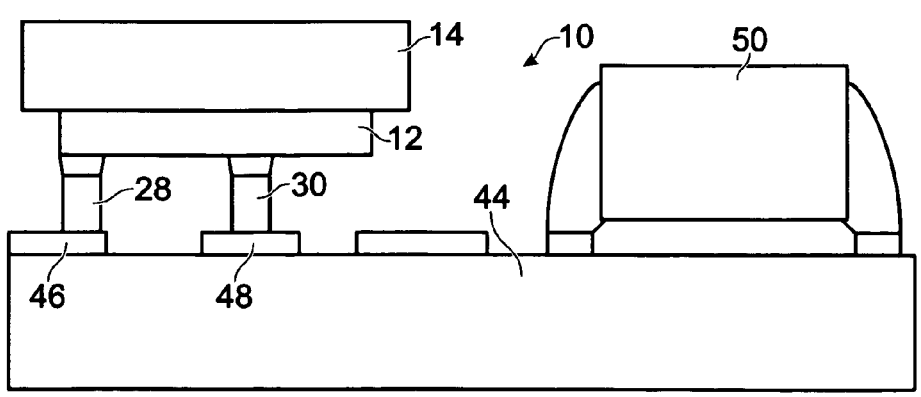
FIG. 8 is a side view of the passive device of FIG. 5 secured on the substrate of FIG. 7.

Numerous applications with high radio frequency (RF) power levels may utilize inductors and/or transformers that can sustain high currents with low transmission loss. In particular, two such applications are high switching-frequency DC-DC converters and RF matching applications on the output of an RF power amplifier. In both of these particular applications, it may be desirable to utilize inductors and/or transformers with a high Quality Factor (Q) that are compact, low profile and low cost.

FIG. 1 is a top view of one example embodiment of a passive device 10 (also referred to herein as device 10), such as an integrated passive device. Device 10 may be an inductor, a coupler, a transformer, a balun transformer, or any other passive device. In the embodiment shown, device 10 includes conductive line 12 positioned on a carrier 14. Carrier 14 may define a top surface 16 which may define a carrier plane 18. Conductive line 12 may be deposited directly on top surface 16, on plane 18, such that conductive line 12 may be referred to as a planar device. In other words, conductive line 12 is positioned on plane 18.

In one example embodiment, conductive line 12 may be manufactured of an electrically conductive material, such as copper that provides high current handling capabilities. In other embodiments, other conductive materials may be utilized, such as aluminum, gold, silver, or mixtures of conductive materials, or the like. Carrier 14 may be manufactured of any suitable material, such as gallium arsenide, glass, silicon-on-insulator, laminate, silicon, any semiconductor material, mixtures thereof, or the like.

Conductive line 12 may define a path 20 on plane 18. Path 20 may have any shape to provide the desired properties for passive device 10. In the embodiment shown in FIG. 1, path 20 defines a concentric spiral path 26 having a first end region 22 at an outer location, and a second end region 24 positioned centrally within spiral 26. Concentric spiral path 26, which is also referred to herein as spiral 26, shown in FIG. 1 may be utilized in an inductor embodiment of passive device 10. Spiral 26 may be defined as any type of path that weaves around itself from an outward first end region 22 to a centrally located second end region 24. Spiral 26 may define a line spacing 27 between adjacent portions of conductive line 12 of approximately 20 microns, and may be in a range of approximately 5 to 100 microns, or any other spacing as may be desired for a particular application. FIG. 1 also includes exposed sidewalls 32.

FIG. 2 shows a cross section through the centerline X-X of the device of FIG. 1. To realize a device with low-loss and high-current handling capability in as small a form factor as possible so that the device is streamlined in shape and may be easily secured on a substrate, unlike bulky wire-wound devices, the conductive lines should have a high aspect ratio. In addition, the spacing between the lines should be small compared to the width and height of the lines. In FIG. 2, the width of conductive line 12 is denoted by W, and the thickness of conductive line 12 is denoted by T, wherein the thickness may be measured perpendicular to and upwardly from top surface 16 of carrier 14, and the spacing between adjacent sections of the line is denoted by S, wherein the spacing may be measured as a nearest distance from one section of a conductive line to an adjacent section of the same conductive line, or a nearest distance from one conductive line to an adjacent conductive line. For a compact, high-performance device of the types disclosed herein, it is desirable that:

$$T/W \geq \alpha \qquad (1)$$

$$\text{and } S \geq \beta \cdot T \qquad (2)$$

$$\text{where } \alpha \approx 0.5, \text{ and } \beta \approx 1.5. \qquad (3)$$

In practical implementations of embodiments of the invention, the line widths may be in a range of approximately 5 to 200 microns, or even in a range of approximately 5 to 65 microns. Additionally, the spacing between adjacent sections of the line may be in a range of approximately 3 to 200 microns, or even in a range of approximately 3 to 60 microns. In one embodiment, passive device 10 may have a conductive line 12 with a thickness T of approximately 65 microns and a spacing S between portions of conductive line 12 of approximately 40 microns. Accordingly, conductive line 12 may be referred to as a "high-aspect ratio" conductive line, defined as a conductive line having a width W and thickness T, where $$T/W \geq \alpha \quad (4)$$

where $0.5 \leq \alpha \leq 1.0$ and $S \leq \beta \cdot T$ (5)

where $0.5 \leq \beta \leq 1.5$. (6)

wherein the actual aspect ratio may be chosen for a particular application.

Referring to FIG. 1, bump 28 may be positioned on first end region 22, in direct electrical contact with first end region 22, and bump 30 may be positioned on second end region 24, in direct electrical contact with second end region 24. Although embodiments of the invention are described in terms of bump 28 and bump 30 positioned on and in direct electrical contact with their respective end regions, bump 28 and bump 30 may be positioned adjacent to and/or have indirect electrical contact with their respective end regions. Bumps 28 and 30 may extend upwardly from conductive line 12 and may be utilized to secure passive device 10 to a substrate 44 (see FIG. 4) utilizing flip chip technology.

FIG. 3 is a side view of passive device 10 of FIG. 1. The use of conductive lines 12 in passive device 10 allows the devices to be manufactured having a high Q, or high inductance per resistance (L/R) ratio.

The Q of a passive element is defined as the ratio of the energy stored in the element to the energy dissipated in the element. For an inductor L, at a frequency F, this is given by $\omega L/R$, where $\omega = 2\pi F$ is the angular frequency and R is the resistance. A Q of infinity is ideal, i.e., in cases where the resistance is zero. The Qs of the inductors of the present invention are in the range of approximately greater than 30, and generally are approximately 40 or more.

At very low frequencies, close to direct current, as in a DC-DC converter, a more useful figure of merit to characterize an inductive element is simply the ratio of its inductance to its resistance, i.e., L/R. Again, for low dissipative losses in the inductor, it is desirable that this ratio be as large as possible.

Bumps 28 and 30 are shown extending upwardly from a top surface 36 of conductive line 12 to a height 38 of approximately 30 microns, and may define any height 38 as may be desired for a particular application. Bump 28 (and, similarly, bump 30) may include a lower region 40, which may be referred to as a pillar region 40, secured directly on second end region 24 of conductive line 12. Pillar region 40 may be manufactured of copper, silver, gold, or other high electrical conductivity (though a low electrical conductivity material may also be used), high melting-point material. Bump 28 may also include a top region 42, which may be referred to as a cap region 42, secured on lower region 40. Cap region 42 may be manufactured of tin, a tin/silver alloy, a tin/silver/copper alloy, or other conductive materials having a low melting-point. In one embodiment, cap region 42 constitutes less than fifty percent of the material in bumps 28 and 30. However, cap region 42 may constitute any percentage, e.g., fifty percent or more than fifty percent, of the material in bumps 28 and 30.

FIG. 4 is a side view of the passive device 10 of FIG. 1 secured on a substrate 44. Passive device 10 may be secured to substrate 44 by bumps 28 and 30 through use of a "flip chip" securement process. In particular, carrier 14 may be secured in an upside down position, with bumps 28 and 30 extending downwardly. The positional terms, "up," "down," and the like, and the particular orientation of the device as shown, are used here merely for illustrative purposes. It should be understood that the embodiments of the invention can be oriented in any manner as may be desirable for a particular application or manufacturing step. Substrate 44 may be manufactured of any suitable material, such as gallium arsenide, glass, silicon-on-insulator, laminate, silicon, any semiconductor material, mixtures thereof, or the like.

The carrier 14 may be placed over substrate 44 in a desired position such that bumps 28 and 30 may be positioned above conductive pads 46 and 48 on substrate 44. Carrier 14 may be lowered (or substrate 44 may be raised), and bumps 28 and 30 may be secured, respectively, to conductive pads 46 and 48. Substrate 44 may include other devices 50 such that passive device 10 may be integrated with such other devices on substrate 44.

FIGS. 5-8 show a second embodiment of passive device 10 wherein bumps 28 and 30 are initially formed on substrate 44. During securement of device 10 on substrate 44, carrier 14 is positioned above substrate 44 such that first end region 22 of conductive line 12 is aligned with bump 28 and second end region 24 of conductive line 12 is aligned with bump 30. Carrier 14 may then be lowered toward substrate 44, or vice verse, or both may be moved, such that conductive line 12 is in direct contact with and is secured to bumps 28 and 30.

Figure 9:
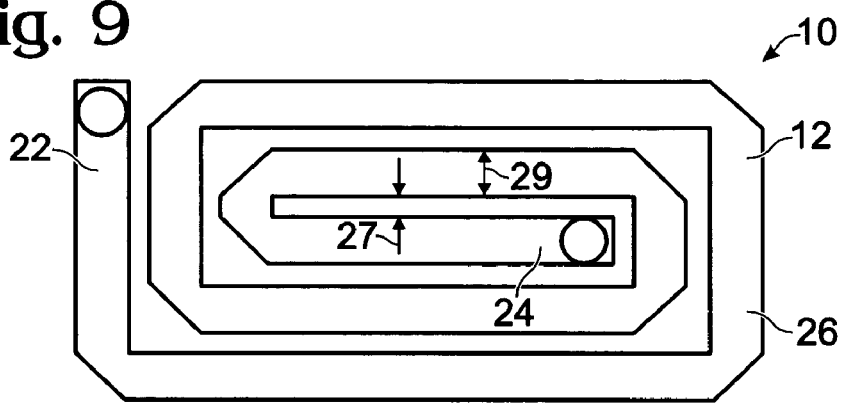
FIGS. 9-11 are top views of other example embodiments of a passive device.
Figure 10:
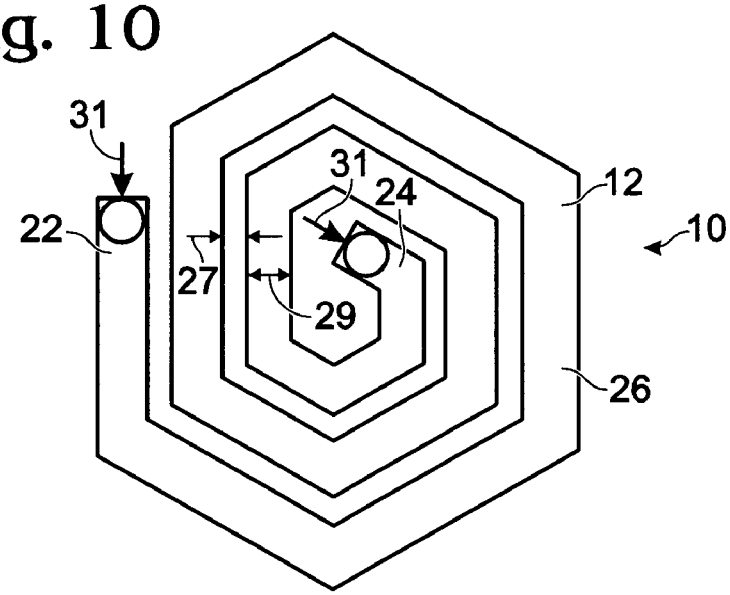
Figure 11:
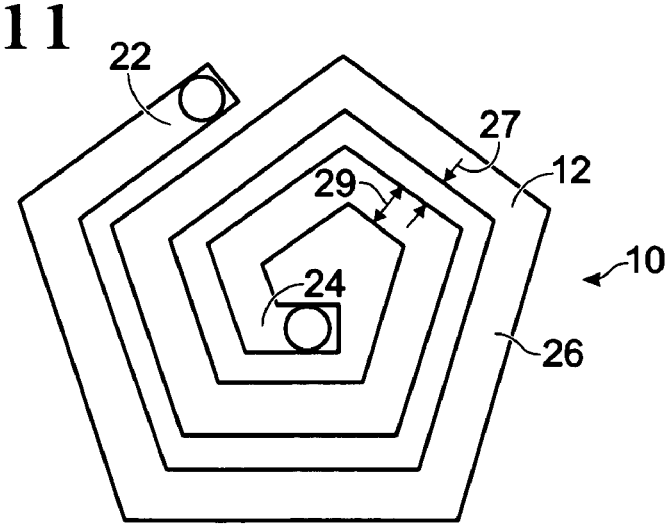
Figure 12:
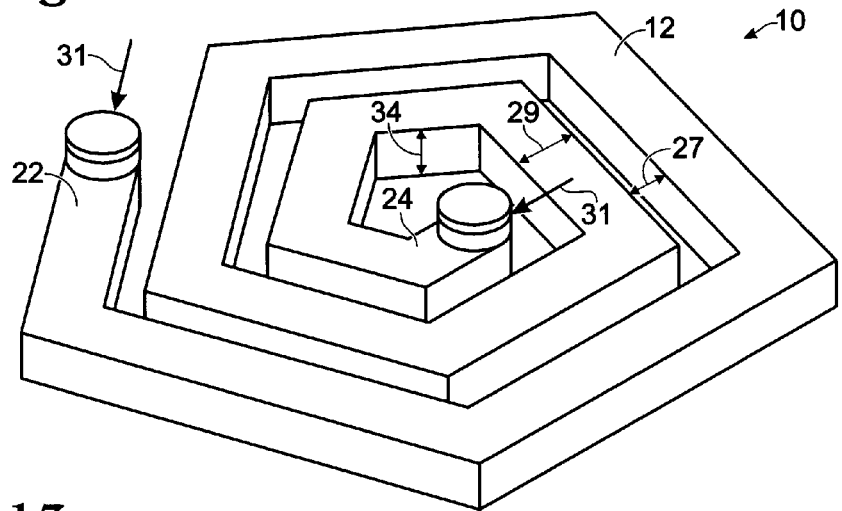
FIG. 12 is an isometric view of the passive device of FIG. 11.

FIGS. 9-12 are top views of other example embodiments of a passive device 10. FIG. 9 shows a rectangular spiral path 26 of conductive line 12. FIG. 10 shows a hexagonal-shaped spiral path 26 of conductive line 12. FIG. 11 shows a pentagonal-shaped spiral path 26 of conductive line 12. FIG. 12 is an isometric view of passive device 10 of FIG. 11 showing spacing 27, width 29, length 31, and height 34 of conductive lines 12.

Figure 13:
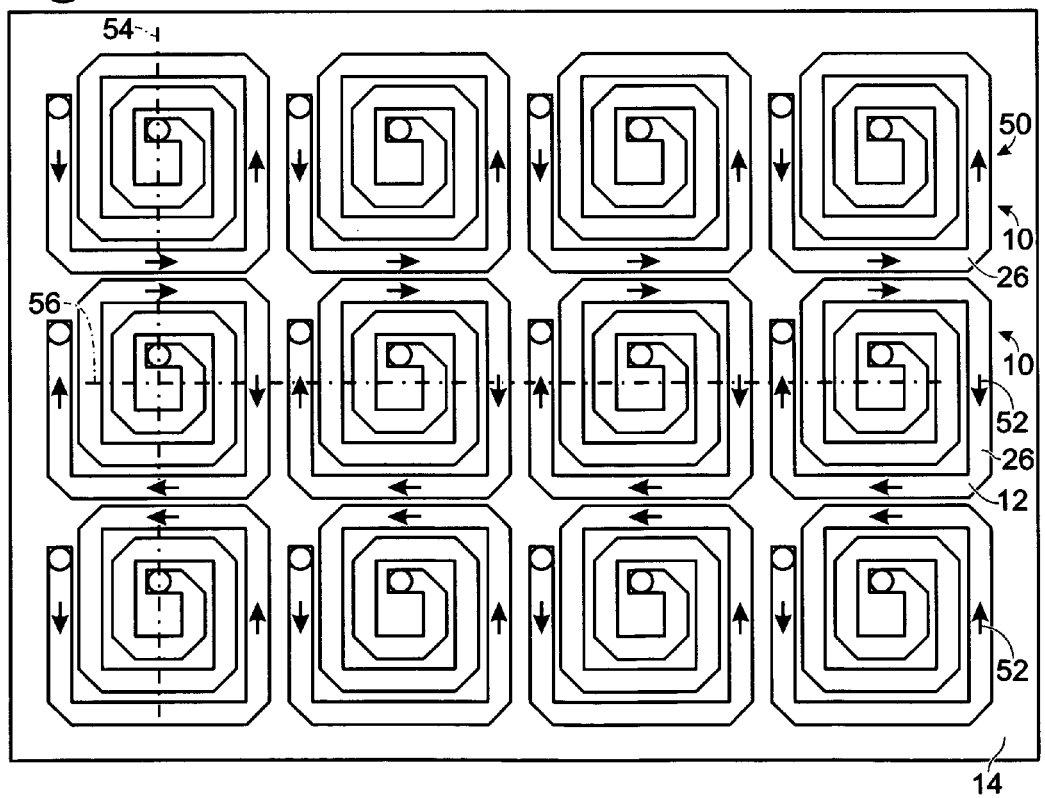
FIGS. 13-17 are top view of arrays of passive devices.

FIGS. 13-17 are top views of arrays of passive devices 10 on a common carrier 14. FIG. 13 shows an array 50 of square-shaped spiral path 26 passive devices 10. In this embodiment, current 52 is shown to run in each passive device 10 in the direction of the arrows as shown. In array 50 shown in FIG. 13, neighboring devices 10 in each of the columns 54 couple in phase with one another. Neighboring devices 10 in each of the rows 56 couple out-of-phase with each other. Thus, there is strong constructive mutual coupling between the individual elements in a column, and strong destructive mutual coupling between the columns of elements.

Figure 14:
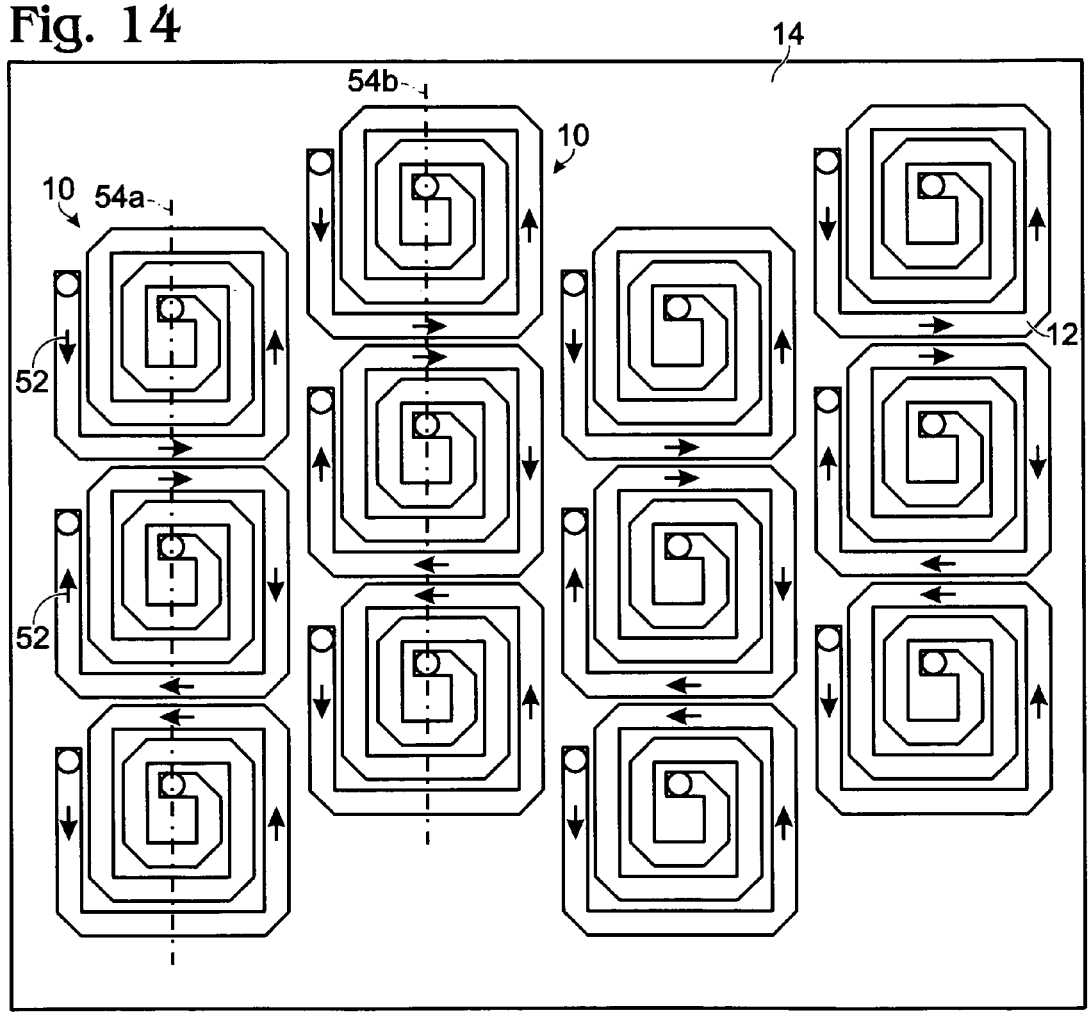

In FIG. 14, passive devices 10 within a single column 54 are coupled to one another constructively as before, but devices 10 within a column 54, such as column 54a, are only weakly coupled to devices 10 within another column 54, such as column 54b, due to the offset nature of devices 10 in adjacent columns. Such complementary coupling characteristic of the array of FIG. 14 is particularly suited for use in interleaved DC-DC converter applications.

Figure 15:
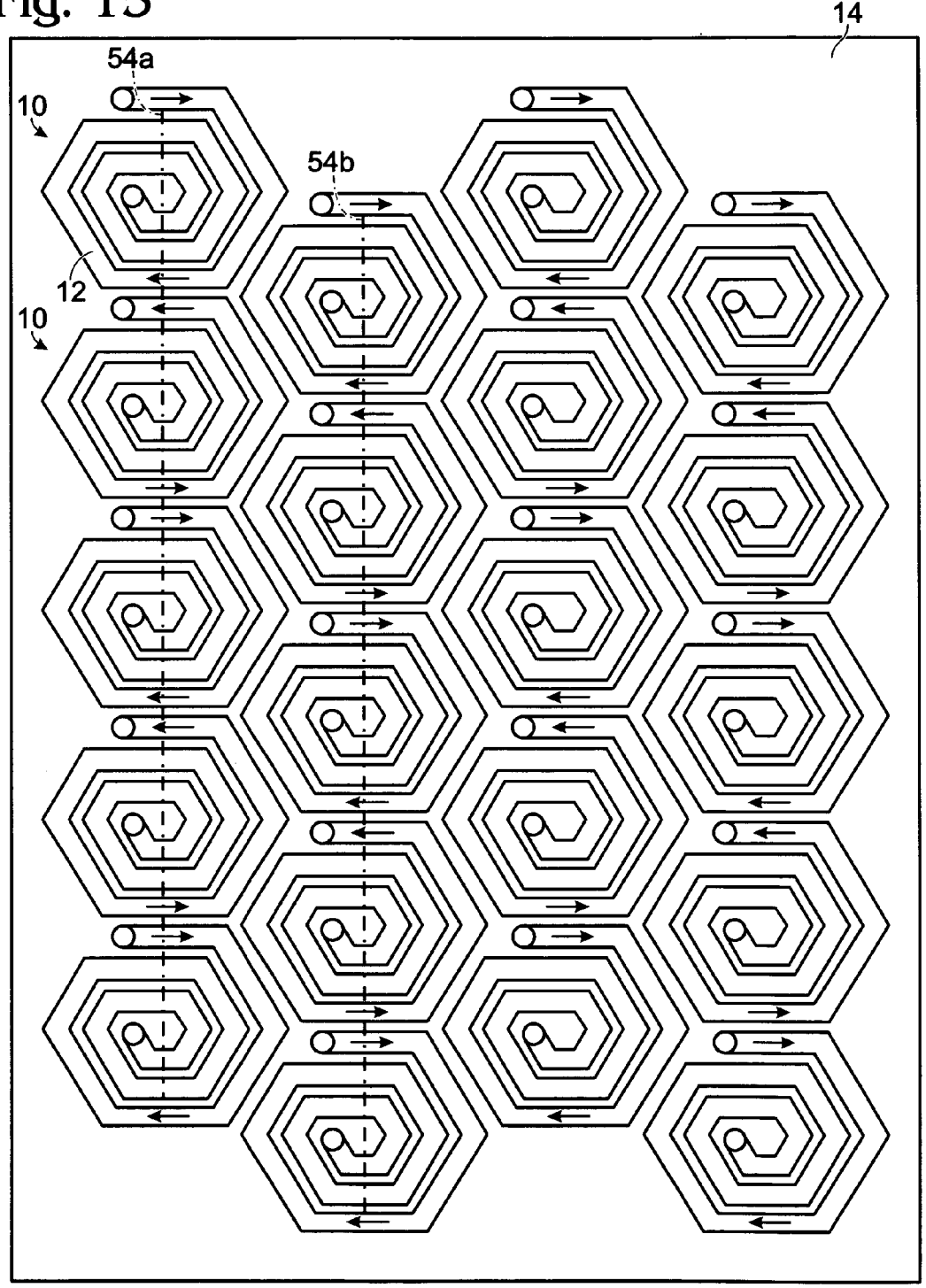

In FIG. 15, similar to FIG. 14, hexagon-shaped passive devices 10 of a column 54a are coupled constructively within the column, but are only weakly coupled with devices 10 of an adjacent column 54b, due to the offset nature of devices 10 in adjacent columns. Such tight-spaced positioning, i.e., such close positioning of adjacent individual passive devices 10 to one another, is possible due the microchip fabrication techniques utilized for producing devices 10 of embodiments of the present invention.

Figure 16:
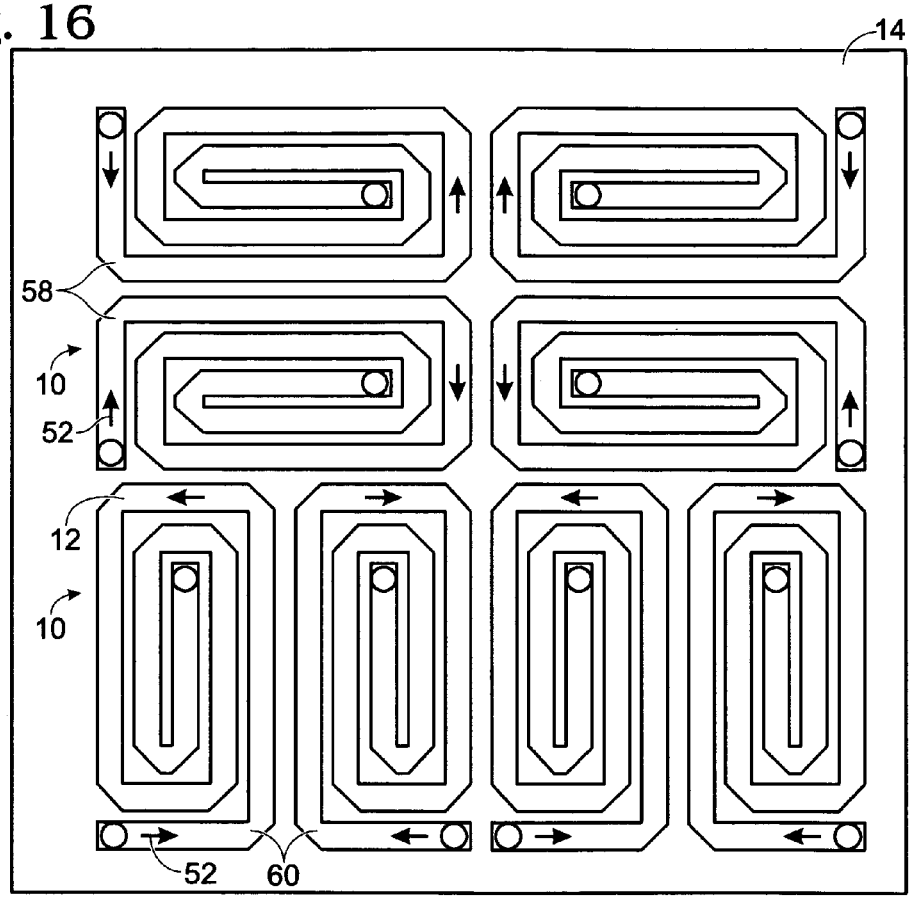

In FIG. 16, rectangular-shaped path passive devices 10 within a first group 58 are coupled constructively to one another within the first group 58, but are not coupled to the devices 10 within a second group 60.

Figure 17:
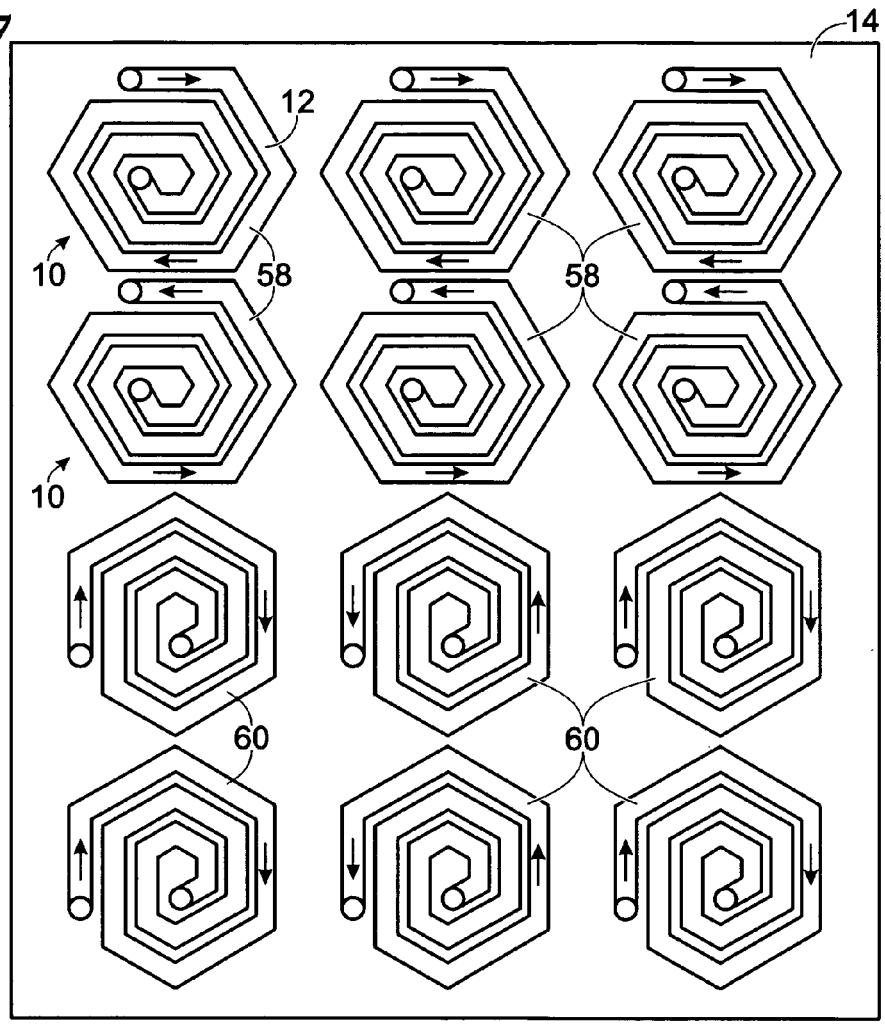

In FIG. 17, hexagon shaped-path passive devices 10 within a first group 58 are coupled to one another constructively within columns of the first group 58, and weakly coupled destructively between adjacent columns. Hexagon-shaped path passive devices 10 within a second group 60 are coupled to one another constructively within rows of the second group 60, and weakly coupled destructively between adjacent rows. Mutual coupling between the two groups 58 and 60 is weak because of the physical orientation of the hexagons.

Figure 18:
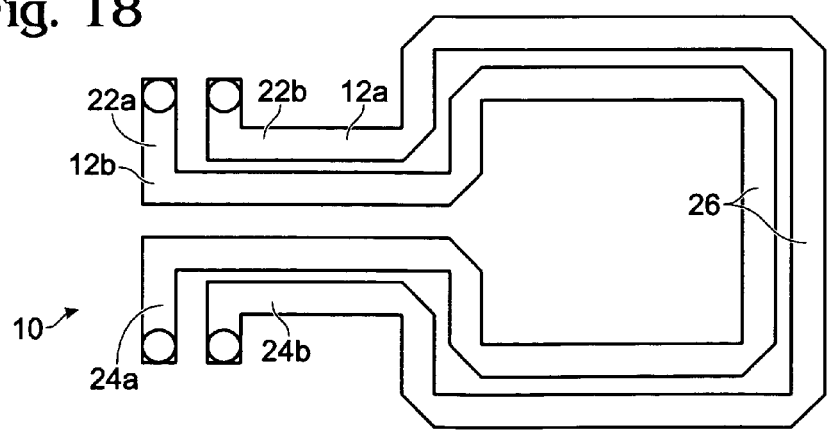
FIG. 18 is a top view of a planar loop transformer passive device.

FIG. 18 is a top view of a planar loop transformer passive device 10 including a first conductive line 12a and a second conductive line 12b. Conductive line 12a forms a loop positioned concentrically and adjacent to second conductive line 12b.

Figure 19:
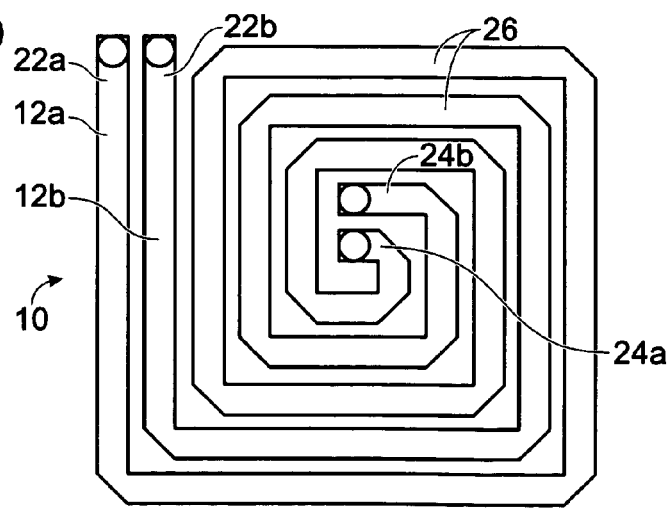
FIG. 19 is a top view of a planar two terminal coupler/transformer passive device.

FIG. 19 is a top view of a planar spiral transformer passive device 10 including a first conductive line 12a and a second conductive line 12b. Conductive lines 12a and line 12b form a double-line, concentric, spiral path 26 having first end regions 22a and 22b and second end regions 24a and 24b, respectively.

Figure 20:
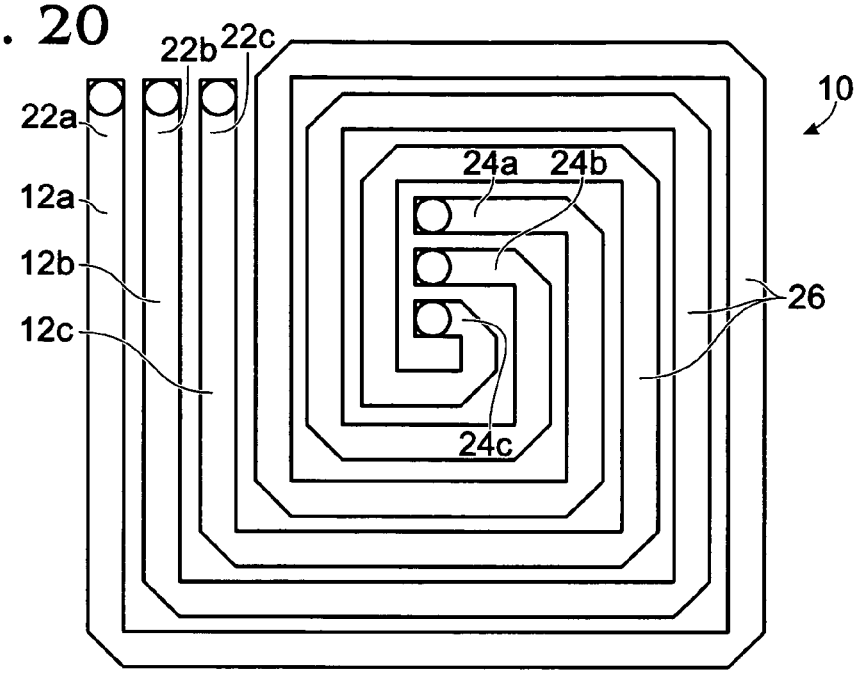
FIG. 20 is a top view of a three terminal coupler/transformer passive device.

FIG. 20 is a top view of a three-terminal coupler/transformer passive device 10. Similar to the device 10 shown in FIG. 19, device 10 forms a triple-line, concentric, spiral path 26. In this embodiment, device 10 includes three conductive lines 12a, 12b and 12c having first end regions 22a, 22b and 22c, and second end regions 24a, 24b and 24c, respectively.

Figure 21:
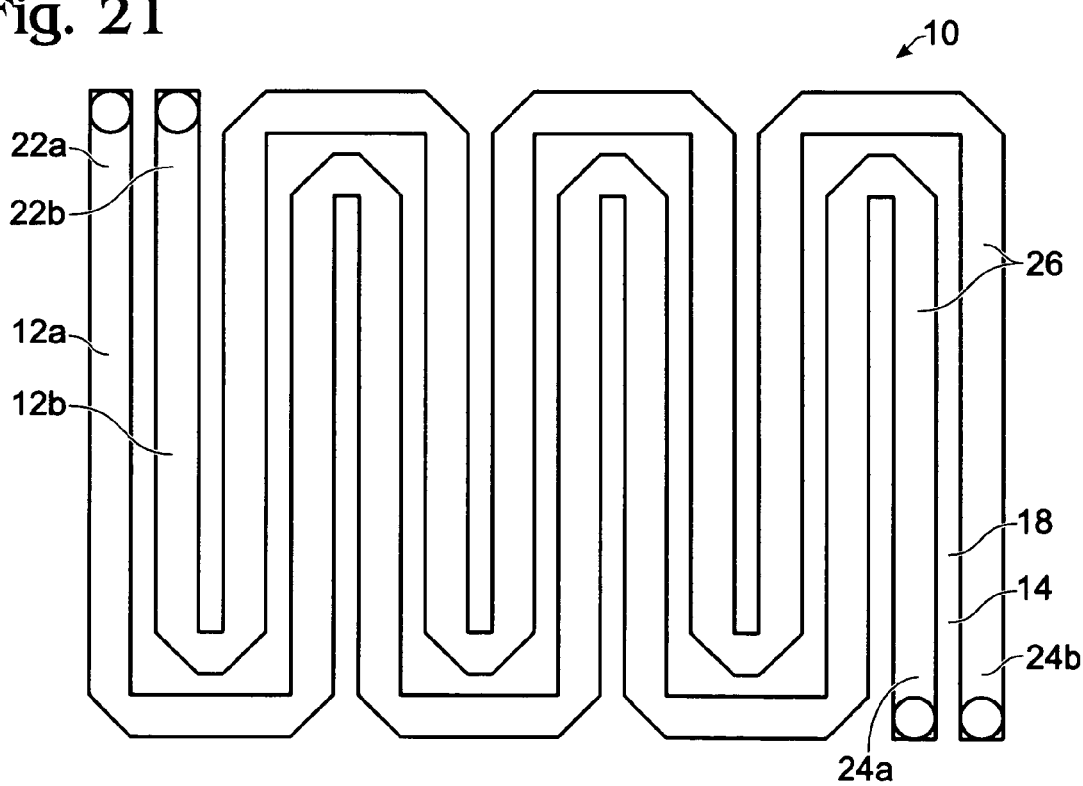
FIG. 21 is a top view of a meander line coupler/transformer passive device.

FIG. 21 is a top view of a meander-line coupler/transformer passive device 10. The term "meander" may be defined as a path that includes several turns, such as the snake-like path shown in FIG. 21. In this embodiment, device 10 includes two conductive lines 12a and 12b that define a meandering path 26, which may be referred to as a snake-like path, having first end regions 22a and 22b and second end regions 24a and 24b, respectively. The conductive lines 12 shown in the embodiments disclosed thus far are each positioned on carrier plane 18 of carrier 14 and, therefore, define a planar passive device 10.

Figure 22:
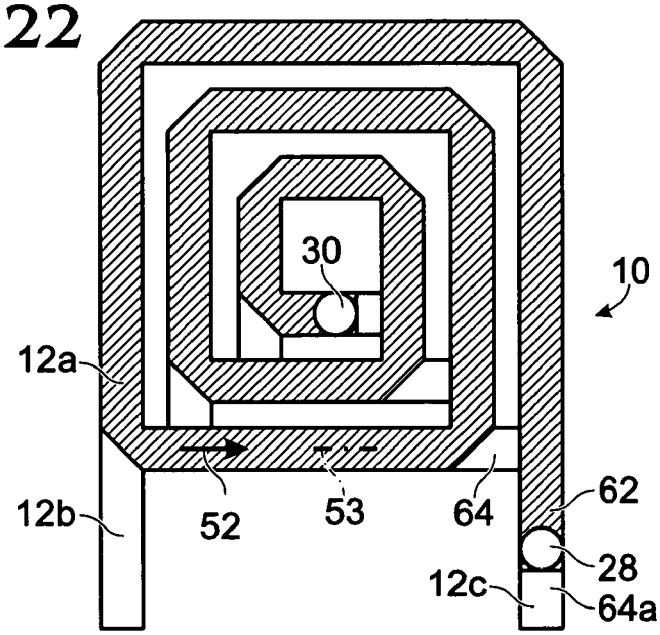
FIG. 22 is a top view of a two plane planar embodiment of a passive device.
Figure 23:
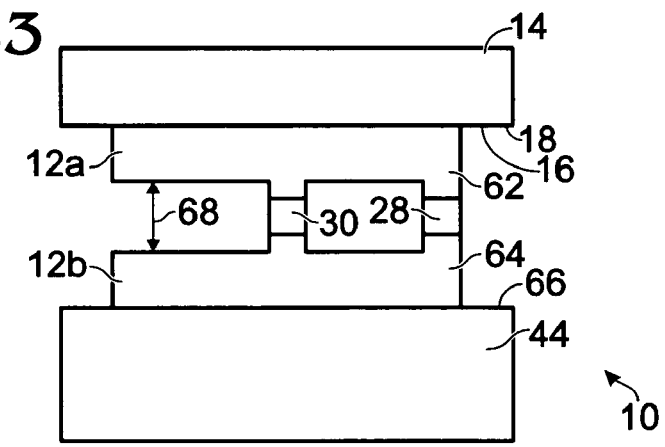
FIG. 23 is a side view of the two plane planar passive device of FIG. 22.

FIGS. 22 and 23 are a top view and a side view, respectively, of a two-plane embodiment of a planar passive device 10. In this embodiment, device 10 includes a first region 62 of conductive line 12a and a second region 64 of conductive line 12b. First region 62 is positioned on carrier plane 18 of carrier 14. Second region 64 is positioned on substrate plane 66 of substrate 44. In the assembled form wherein carrier 14 is secured on substrate 44 by bumps 28 and 30, conductive line 12a on carrier plane 18 may be separated from conductive line 12b and 12c on substrate plane 66 by a distance 68 of approximately 80 microns, for example, and may be a range of approximately 30 to 200 microns, or any distance as may be desired for a particular application. First region 62 is electrically and mechanically connected to second region 64 and 64a by bumps 30 and 28. Bump 30 extends between conductive lines 12a on carrier plane 18 and 12b on substrate plane 66, bump 28 extends between conductive lines 12a on carrier plane 18 and 12c on substrate plane 66.

This embodiment defines two inductor loops, wherein first region 62 defines the first inductor loop of device 10, and wherein second region 64 defines the second inductor loop of device 10. First region 62 and second region 64 of this embodiment are planar because they are each positioned on planes 18 and 66, respectively. However, due to the electrical and mechanical connection of these two planar loops by bumps 28 and 30, which extend between planes 18 and 66, device 10 may be described as a planar device, even though path 53 of electrical current 52 through device 10 may be non-planar.

Figure 25:
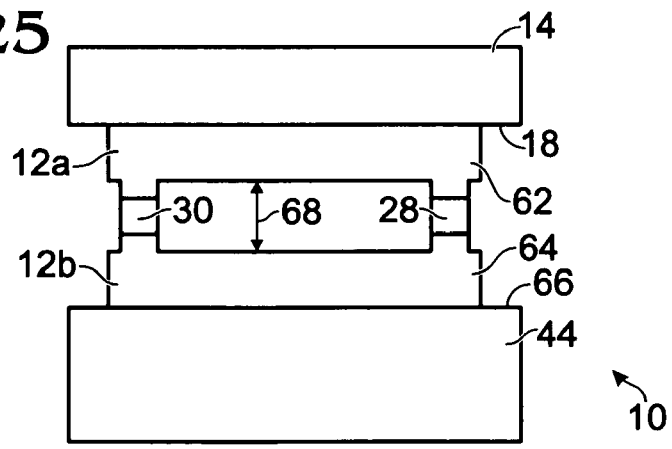
FIG. 25 is a side view of the two plane planar passive device of FIG. 24.

FIGS. 24 and 25 are a top and a side view, respectively, of another two-plane embodiment of a planar passive device 10. In this embodiment, device 10 includes first regions 62a-62f of conductive line 12 and second regions 64a-64g of conductive line 12. First regions 62a-62f are positioned on carrier plane 18 of carrier 14. Second regions 64a-64g are positioned on substrate plane 66 of substrate 44. In the assembled form, wherein carrier 14 is secured on substrate 44, the distance 68 between the opposing surfaces of the conductive regions 62a-62f and 64a-64g is typically greater than 40 microns, to allow for a free-flow of passivation material between the surfaces during the assembly process. The distance 68 may also be greater than this for a particular embodiment to increase the desired electrical characteristics of the device.

First regions 62a-62f are electrically and mechanically connected to second regions 64a-64f by bumps 28a-28f and 30a-30f. This embodiment defines a single inductor loop 82, wherein inductor loop 82 defines an electrical current pathway 53 that moves along its spiral path 26, alternating between first plane 18 and second plane 66 through the bumps that extend between planes 18 and 66. Accordingly, the device 10 shown in FIGS. 24 and 25 defines a three-dimensional coiled-type inductor loop while providing the benefits of manufacturing the device utilizing micro fabrication techniques on separate planar surfaces 18 and 66. In other words, first regions 62a-62f may be manufactured as a planar first region 62, second regions 64a-64g may be manufactured as a second planar second region 64, and the first and second regions 62 and 64 may be secured to one another by flip-chip mounting techniques using bumps positioned directly on the conductive lines 12.

Stated another way, each of the regions 62 and 64 of this embodiment are planar because they are each positioned on a planes 18 and 66, respectively. However, due to the electrical and mechanical connection of individual portions of these two planar regions by bumps 28 and 30, which extend between planes 18 and 66, device 10 may be described as a planar device, even though the path 53 of electrical current 52 through the device 10 may be non-planar. The three-dimensional, "coiled pathway" 53 for current 52 is defined by manufacture of two planar components which are connected by bumps 28 and 30 positioned directly on the planar, conductive lines 12. Embodiments of the invention, therefore, provide the benefits of integrated planar manufacturing techniques while simultaneously providing a passive device 10 having desirable inductor/coupler/transformer qualities due to its out-of-plane electrical current pathway 53. The use of bumps 28 and 30 positioned directly on planar, conductive lines 12 provides these desirable device and manufacturing advantages.

In the previous embodiments shown, the magnetic flux lines of the inductive elements, couplers, or transformers were primarily normal to both the carrier and the substrate surfaces. Thus, the flux lines penetrate substantially into the body of both materials. If one of these materials has a finite, non-zero, conductivity, this can lead to electrical losses that can degrade the performance of the passive elements. In contrast, in the embodiment shown in FIGS. 24 and 25 the magnetic flux lines are primarily parallel to the surfaces of both the carrier 14 and the substrate 44. Thus, the magnetic flux lines penetrating each material should be substantially reduced, thereby reducing any potential parasitic electrical losses of the elements.

In the embodiment shown in FIGS. 24 and 25, the region 64 of passive device 10 that is formed on substrate 44 is shown on a top surface of substrate 44. However, in other embodiments, conductive lines 12 may be formed on substrate 44 and thereafter partially covered so that the conductive lines 12 may be positioned at least partially within an interior of substrate 44 (see FIG. 28).

FIG. 26 is a top view of a two-plane coupler/transformer planar passive device 10 similar to the device shown in FIG. 24, but including two inductor loops 70 and 72. First inductor loop 70 may include regions 62a, 62b, and 62c of conductive line 12a, and regions 64a, 64b, 64c and 64d of conductive line 12b. Regions 62a, 62b and 62c are positioned on carrier plane 18 of carrier 14 (see FIG. 4). Regions 64a, 64b, 64c and 64d are positioned on substrate plane 66 of substrate 44 (see FIG. 4). Regions 62a, 62b and 62c are electrically and mechanically connected to regions 64a, 64b, 64c and 64d, respectively, by bumps 28a, 28c and 28e and are connected to regions 64b, 64c and 64d, respectively, by bumps 30a, 30c and 30e.

Second inductor loop 72 may include regions 63a, 63b, and 63c of conductive line 12a and regions 65a, 65b, 65c, and 65d of conductive line 12b. Regions 63a, 63b and 63c are positioned on carrier plane 18 of carrier 14. Regions 65a, 65b, 65c and 65d are positioned on substrate plane 66 of substrate 44. Regions 63a, 63b and 63c are electrically and mechanically connected to regions 65a, 65b and 65c, respectively, by bumps 28b, 28d and 28f and are connected to regions 65b, 65c and 65d, respectively, by bumps 30b, 30d and 30f.

This embodiment defines a double inductor loop, wherein the loops 70 and 72 move along their spiral paths 26a and 26b, alternating between first plane 18 and second plane 66. Accordingly, passive device 10 provides the benefits of current paths 53a and 53b that are non-planar, while providing the manufacturing benefits of integrated, planar devices. This embodiment similarly allows manufacturing with less magnetic flux in the substrate 44, resulting in potentially lower bulk losses.

Figure 27:
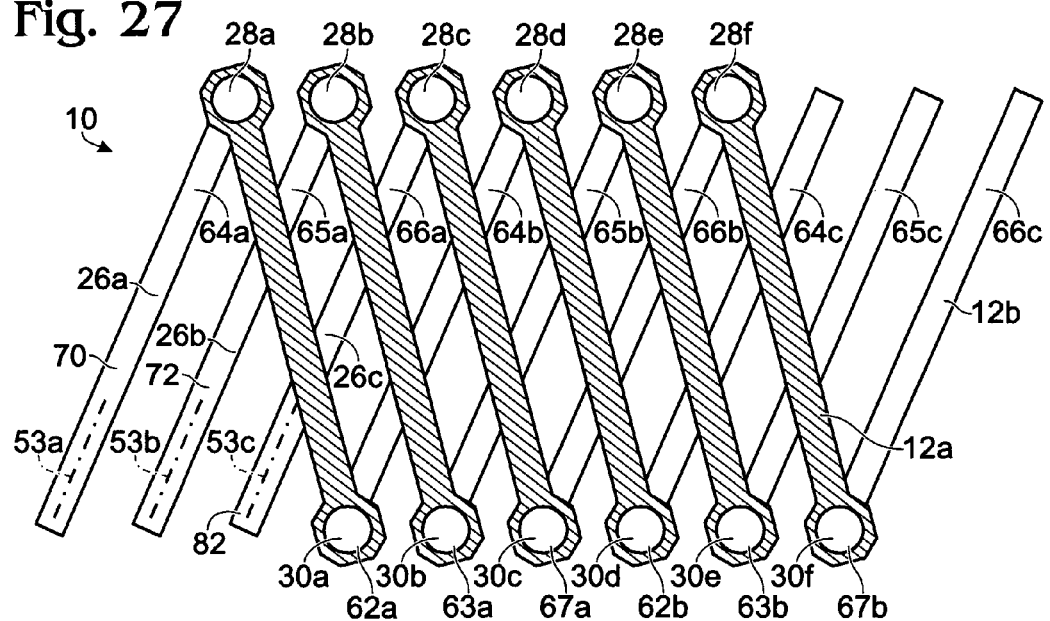
FIG. 27 is a top view of two-plane planar balun/transformer passive device.

FIG. 27 is a top view of a two-plane balun/transformer planar passive device 10 similar to the device shown in FIG. 26, but including three inductor loops 70, 72 and 82. First inductor loop 70 may include first regions 62a and 62b of conductive line 12a and second regions 64a, 64b, and 64c of conductive line 12b. First regions 62a and 62b are positioned on carrier plane 18 of carrier 14. Second regions 64a, 64b, and 64c are positioned on substrate plane 66 of substrate 44. First regions 62a and 62b are electrically and mechanically connected to second regions 64a, 64b, and 64c, respectively, by bumps 28a and 28d and to second regions 64b and 64c, respectively, by bumps 30a and 30d.

Second inductor loop 72 may include first regions 63a and 63b of conductive line 12a and second regions 65a, 65b, and 65bc of conductive line 12b. First regions 63a and 63b are positioned on carrier plane 18 of carrier 14. Second regions 65a, 65b, and 65c are positioned on substrate plane 66 of substrate 44. In the assembled form, wherein carrier 14 is secured on substrate 44, conductive line 12b on carrier plane 18 may be separated from conductive line 12c on substrate plane 66 by a distance 68 shown in FIG. 28. First regions 63a and 63b are electrically and mechanically connected to second regions 65a, 65b, and 65c, respectively, by bumps 28b and 28e and to second regions 65b and 65c, respectively, by bumps 30b and 30e.

Third inductor loop 82 may include first regions 67a and 67b of conductive line 12a, and second regions 66a, 66b, and 66c of conductive line 12b. First regions 67a and 67b are positioned on carrier plane 18 of carrier 14. Second regions 66a, 66b, and 66c are positioned on substrate plane 66 of substrate 44. In the assembled form, wherein carrier 14 is secured on substrate 44, carrier plane 18 may be separated from substrate plane 66 by a distance similar to distance 68 shown in FIG. 25. First regions 67a and 67b are electrically and mechanically connected to second regions 66a, 66b, and 66c, respectively, by bumps 28c and 28f and to second regions 66b and 66c, respectively, by bumps 30c and 30f.

This embodiment defines a triple inductor loop, wherein the loops move along their spiral paths 26a, 26b and 26c, alternating between first plane 18 and second plane 66 through the bumps. The device 10 is referred to as a planar device because the components of conductive lines 12a, 12b and 12c are each manufactured in a plane utilizing micro fabrication techniques. Accordingly, planar passive device 10 provides the benefits of current paths 53a, 53b and 53c that are non-planar, while providing the manufacturing benefits of integrated, planar devices.

Figure 28:
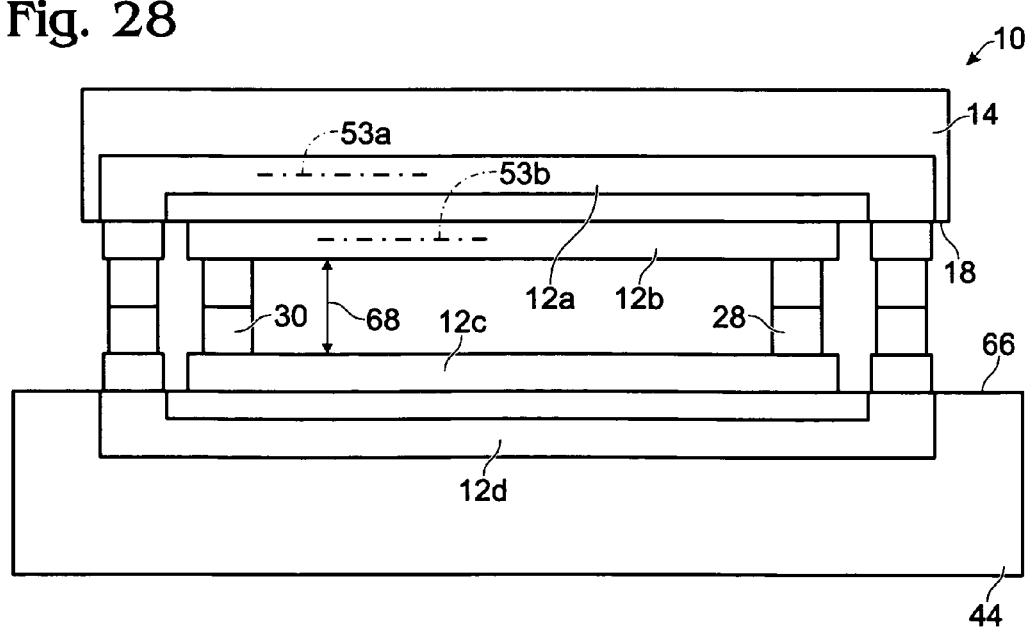
FIG. 28 is a side view of another embodiment of a passive device.

FIG. 28 is a side view of an inductor passive device 10 with windings in the substrate 44 and the carrier 14. In particular, device 10 may include a first planar conductive line 12a embedded within carrier 14, a second planar conductive line 12b on carrier plane 18 of carrier 14, a third planar conductive line 12c on substrate plane 66 of substrate 44, and a fourth planar conductive line 12d embedded within substrate 44. In this embodiment, concentric turns may be possible with a multi-layer construction on a hard substrate material such as a semiconductor or glass, or with the use of soft carrier and soft substrate materials, such as laminate. Accordingly, the passive device 10 shown in this embodiment may include two non-planar electrical current pathways 53a and 53b that are manufactured utilizing integrated circuit, planar fabrication techniques.

The process of manufacturing passive device 10 will now be described with reference to FIGS. 1-4. A conductive metallic film, typically referred to as a field metal, is deposited on the plane 18 of carrier 14. A first layer of photoresist is then deposited over the field metal and processed by, for example, photolithographic techniques to remove said material from areas where conductive line 12 is desired. The exposed areas of field metal, defining the desired conductive line 12 are then plated using, for example, electroplating. After deposition of conductive line 12, the photoresist may be removed, such as by etching, such that conductive line 12 remains on carrier 14 with exposed sidewalls 32.

If bumps are required, such as 28 and 30, on conductive line 12, a second layer of photoresist is now applied to the substrate 44. The thickness of the second photoresist layer exceeds that of conductive line 12, and thus uniformly covers plane 18. By, for example, photolithographic techniques, apertures are opened up in the second photoresist layer over the locations for the bumps, in order to expose the metal of conductive line 12. These exposed areas of metal are then plated up with layers of metal, for example, two layers of metal, in order to form the bumps, using, for example, electroplating.

The first layer may be manufactured of copper, and the second layer which may be thinner or thicker relative to the first layer, or the same size as the first layer, and may be manufactured of tin, or combinations of tin with other metals in smaller proportion. After the plating up of the bumps on conductive line 12, the photoresist is removed, by a method such as etching. The field metal is then removed from plane 18 of carrier 14. This removal may be achieved by means of either wet or dry etching.

In another embodiment, conductive line 12 may define a planar interconnect routing path, much like an option plate to define routing after the die/substrate is manufactured.

Figure 29A:
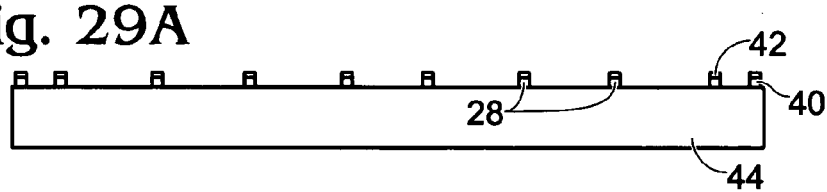
FIGS. 29a-29d are side views of a mounting process in which bumps are positioned on a substrate.

FIGS. 29a-29d are side views of a mounting process in which bumps are positioned on a substrate. This process may be used to package to mount or package any device, including, but not limited to, embodiments of passive device 10 described herein. In FIG. 29a shows plating bumps 28 on a substrate 44, such as a silicon wafer, for example. Bumps 28 may be, for example, Cu/Sn bumps that include, for example, a copper pillar region 40 having a height of greater than 45 micrometers and a tin cap region 42 having a height of greater than 20 micrometers. Bumps 28 may be formed on substrate 44 by any suitable method.

Figure 29B:
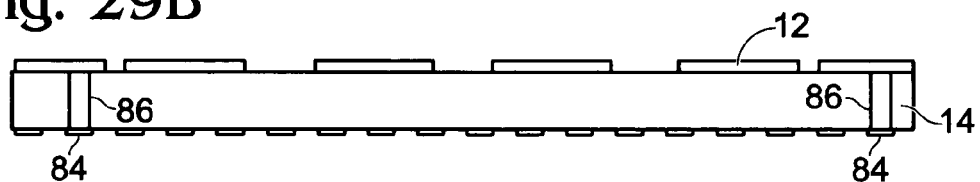

FIG. 29b shows the plating of conductive lines 12, such as, for example, inductors, transformers and traces, on a carrier 14, such as, for example, a laminate wafer. Conductive lines 12 may be, for example, Cu/Sn conductive lines, and conductive lines 12, such as inductors, transformers and traces, may have, for example, a height of greater than 45 microns. Carrier 14 may also include connection pads 84 used to connect carrier 14 to a structure or device (not shown) on which carrier 14 may be placed, wherein the structure or device has connection points that correspond to connection pads 84. In addition, carrier 14 may include vias 86 through carrier 14 that provide electrical connections between conductive lines 12 and connection pads 84.

Figure 29C:
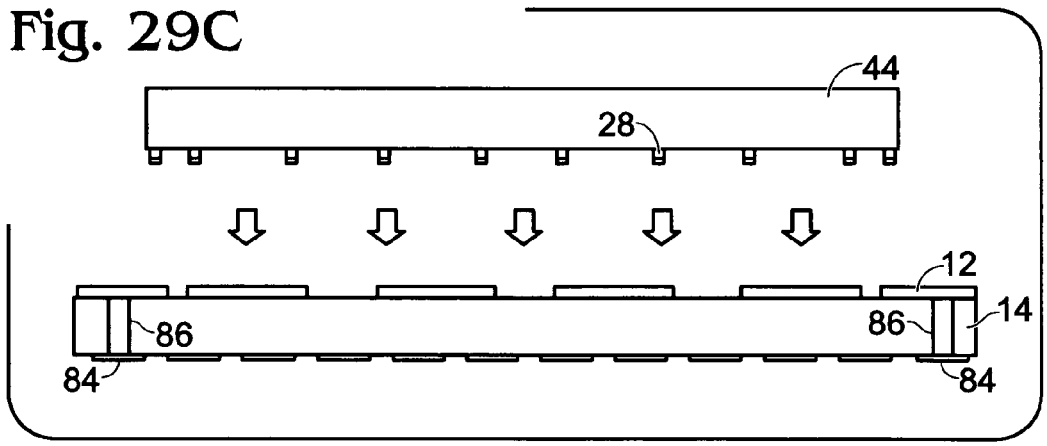

FIG. 29c shows "flip-chip" attaching carrier 14 to substrate 44 by flip-chip mounting. "Flip-chip" attaching may include positioning substrate 44 over carrier 14, with bumps 28 facing downwardly and aligned on conductive lines 12. Conductive lines 12 and bumps 28 are then secured together by any suitable method such as, for example, heating, application of a pressure force, and the like.

Figure 29D:
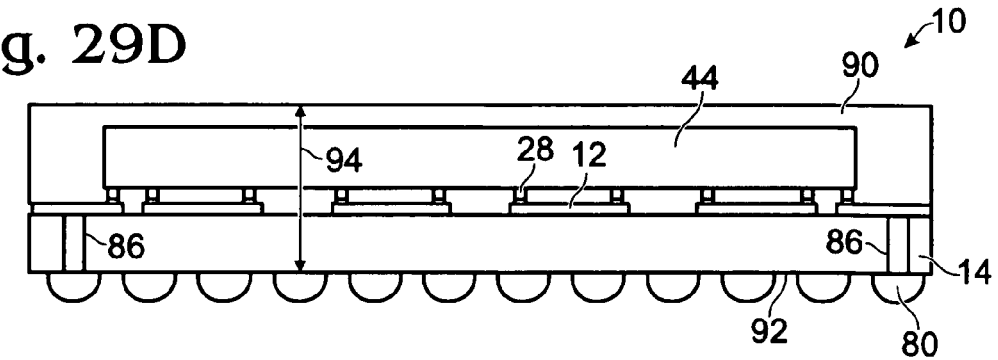

FIG. 29d shows applying an overmold 90 to device 10. Overmold 90 may be, for example, an epoxy applied under pressure to seal device 10. This may then include singulation of device 10 from other devices on substrate 44 and applying solder bumps 80 to an underside 92 of carrier 14. The mounting process may produce a device 10 having a height 94 of approximately one millimeter or less. Carrier 14 may include vias 86 through carrier 14 that provide electrical connections between conductive lines 12 and solder bumps 80.

Figure 30A:
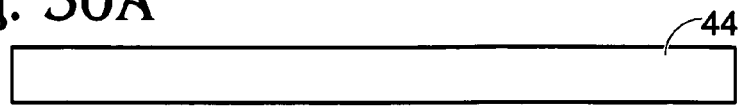
FIGS. 30a-30d are side views of a mounting process in which bumps are positioned on a carrier.

FIGS. 30a-30d are side views of a mounting process in which bumps 28 are positioned on a carrier. This process is similar to the process described with respect to FIGS. 29a-29d, except that bumps 28 are initially formed on conductive lines 12 on carrier 14. FIG. 30a shows substrate 44 without bumps formed thereon. Substrate 44 may be a silicon wafer, for example.

Figure 30B:
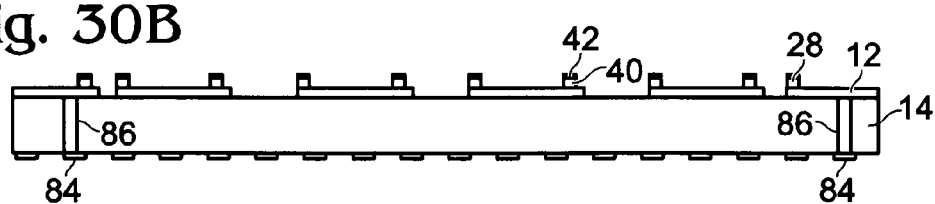

FIG. 30b shows plating conductive lines 12, such as inductors, transformers and traces, on a carrier 14, such as, for example, a laminate wafer. Conductive lines 12 may be, for example, Cu/Sn conductive lines. Conductive lines 12, such as, for example, inductors, transformers and traces, may have a height of greater than 45 microns. FIG. 30b may further include plating Cu/Sn bumps 28 on conductive lines 12. Bumps 28 may be, for example, Cu/Sn bumps that include, for example, a copper pillar region 40 having a height of greater than 45 micrometers and a tin cap region 42 having a height of greater than 20 micrometers. Bumps 28 may be formed on carrier 14 or conductive lines 12 by any suitable method. Carrier 14 may also include connection pads 84 used to connect carrier 14 to a structure or device (not shown) on which carrier 14 may be placed, wherein the structure or device has connection points that correspond to connection pads 84. In addition, carrier 14 may include vias 86 through carrier 14 that provide electrical connections between conductive lines 12 and connection pads 84.

Figure 30C:
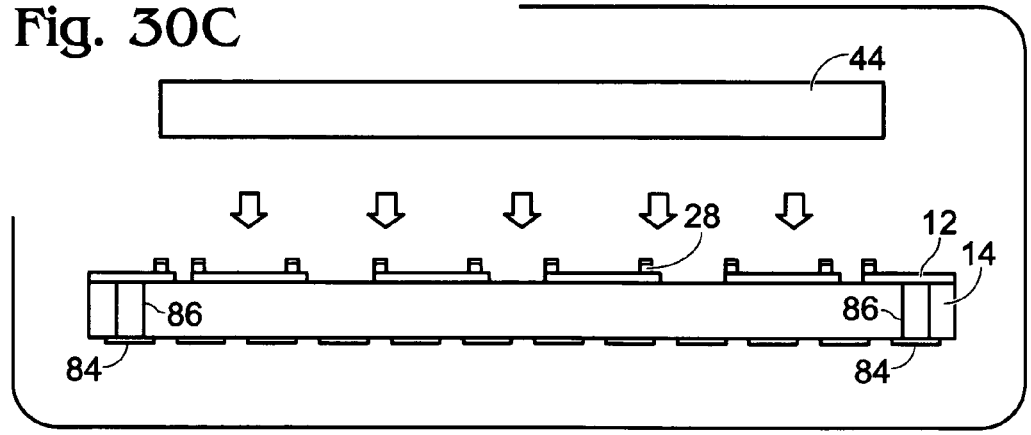

FIG. 30c shows attaching carrier 14 to substrate 44 by flip-chip mounting. This may include positioning substrate 44 over carrier 14, with bumps 28 facing upwardly toward substrate 44. Conductive lines 12, with bumps 28 secured thereon, are then secured to substrate 44 by any suitable method such as, for example, heating, application of a pressure force, and the like.

Figure 30D:
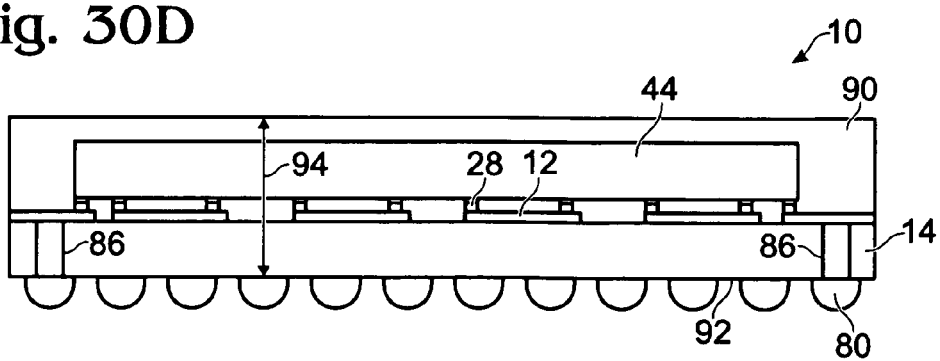

FIG. 30d shows applying an overmold 90 to device 10. Overmold 90 may be, for example, an epoxy applied under pressure to seal device 10. This may then include singulation of device 10 from other devices on substrate 44 and applying solder bumps 80 to an underside 92 of carrier 14. This process may produce a device 10 having a height 94 of approximately one millimeter or less. Carrier 14 may include vias 86 through carrier 14 that provide electrical connections between conductive lines 12 and solder bumps 80.

Figure 31A:
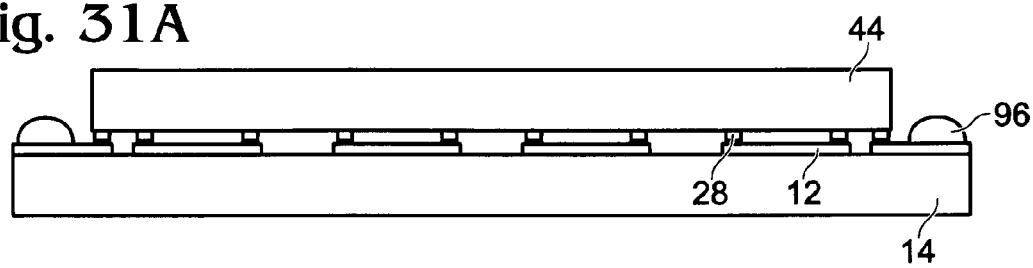
FIGS. 31a-31b are side views showing connection to a device on a hard substrate.
Figure 31B:
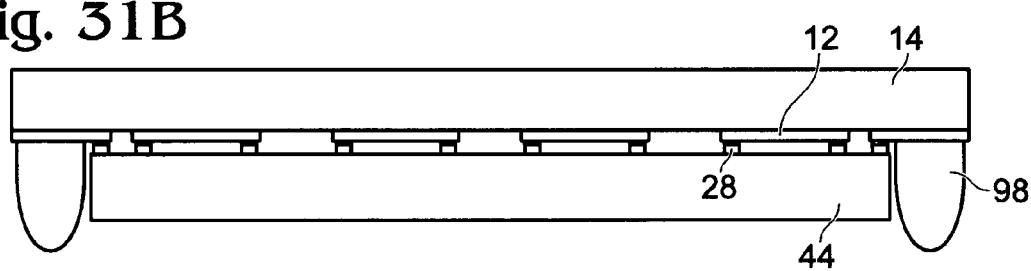

FIGS. 31a-31b are side views showing connection to a device 10 on a hard substrate 44. In an embodiment wherein a hard substrate 44, such as, for example, glass, is utilized, it may be difficult to place vias (not shown) through hard substrate 44. Accordingly, the input and output terminals of conductive lines 12 may be connected with wire bond connections 96, shown in FIG. 31a, or with large conductive bumps 98, shown in FIG. 31b.

Other variations and modifications of the concepts described herein may be utilized and fall within the scope of the claims below.

We claim:

1. An integrated passive device, comprising:
   a first conductive line section positioned on a planar topmost surface of a carrier and having width W and thickness T, where T/W at least 0.5;
   a second conductive line section positioned on said planar topmost surface of said carrier wherein a nearest distance from said second conductive line section to said first conductive line section is S, where S is at most 1.5.T;
   a substrate; and
   a bump positioned directly on said first conductive line section, said bump including a height that has a region of a high melting-point conductor and a region of a low melting-point conductor, said bump securing said first conductive line section to said substrate and having a height of at least 30 μm wherein said bump is positioned between said first conductive line section and said substrate.

2. The device of claim 1 wherein said first conductive line section is a portion of a first integrated passive component, and wherein said second conductive line section is chosen from one of another section of said first integrated passive component and a section of a second integrated passive component.

3. The device of claim 1 wherein the bump is mounted directly to an upper surface of the first conductive line section.

4. The device of claim 1 wherein the region of the high melting-point conductor of said bump is positioned directly on said first conductive line section prior to securement of said first conductive line section to said substrate.

5. The device of claim 1 wherein the high melting-point conductor of said bump is positioned on said substrate prior to securement of said first conductive line section to said substrate, and wherein the low melting-point conductor of said bump is positioned directly against said first conductive line section after securement thereto.

6. The device of claim 2 wherein the high melting-point conductor of said bump is positioned directly on said first conductive line section prior to securement of said first conductive line section to said substrate.

7. The device of claim 2 wherein the high melting-point conductor of said bump is positioned on said substrate prior to securement of said first conductive line section to said substrate, and wherein the low melting-point conductor of said bump is positioned directly against said first conductive line section after securement of said first conductive line section.

8. The device of claim 1 wherein said integrated passive device comprises a device chosen from the group consisting of an inductor, a coupler, a balun, and a transformer.

9. The device of claim 1 wherein said first conductive line section is manufactured of a material chosen from the group consisting of copper, silver, and gold.

10. The device of claim 1 wherein said carrier is manufactured of a material chosen from the group consisting of gallium arsenide, glass, silicon on insulator, laminate, silicon, a semiconductor material, and a high resistivity material.

11. The device of claim 1 wherein said substrate is manufactured of a material chosen from the group consisting of gallium arsenide, glass, silicon on insulator, laminate, silicon, a semiconductor material, and a high resistivity material.

12. The device of claim 1 wherein said first conductive line section comprises a section of a planar, spiral path.

13. The device of claim 1 wherein said first conductive line section comprises a section of a planar interconnect routing path.

14. The device of claim 1 wherein said first and second conductive line sections comprise sections of at least two planar paths, concentrically positioned adjacent one another.

15. The device of claim 1 wherein said first and second conductive line sections comprise sections of at least two planar meandering paths, positioned adjacent one another.

16. The device of claim 1 wherein said first conductive line section defines a path that includes at least one segment in a first plane and at least one segment in a second plane, and wherein a junction between said one segment in said first plane and said one segment in said second plane is defined by said bump.

17. The device of claim 1 wherein said device defines a Quality Factor of at least 20.

18. The device of claim 1 wherein said bump includes a pillar region manufactured of one of copper and silver, and a cap region manufactured of a material chosen from one of tin, a tin/silver alloy, and a tin/silver/copper alloy.

19. The device of claim 1 wherein said thickness T is at least 40 μm.

20. The device of claim 1 wherein said first conductive line section is manufactured on said carrier by a micro fabrication process including electroplating.

21. An integrated passive device, comprising:
a first conductive line section positioned on a planar outermost surface of a carrier and having a width W and a thickness T, where T/W is at least 0.75;
a second conductive line section positioned on said planar outermost surface of said carrier wherein a nearest distance from said first conductive line section to said second conductive line section is S, where S is at most 1.0.T;
a substrate; and
a bump positioned directly on said first conductive line section, said bump including a region of a high melting-point conductor and a region of a low melting-point conductor, said bump securing said first conductive line section to said substrate and having a height of at least 30 μm wherein said bump is positioned between said first conductive line section and said substrate.

22. The device of claim 21 wherein said thickness T is at least 40 μm.

* * * * *